(12) United States Patent (10) Patent No.: US 7,408,265 B2
Holscher et al. (45) Date of Patent: Aug. 5, 2008

(54) USE OF A DUAL-TONE RESIST TO FORM PHOTOMASKS INCLUDING ALIGNMENT MARK PROTECTION, INTERMEDIATE SEMICONDUCTOR DEVICE STRUCTURES AND BULK SEMICONDUCTOR DEVICE SUBSTRATES

(75) Inventors: Richard D. Holscher, Boise, ID (US); Ardavan Niroomand, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 365 days.

(21) Appl. No.: 10/897,165

(22) Filed: Jul. 22, 2004

(65) Prior Publication Data

US 2004/0259320 A1 Dec. 23, 2004

Related U.S. Application Data

(62) Division of application No. 10/219,168, filed on Aug. 15, 2002, now Pat. No. 6,815,308.

(51) Int. Cl.
*H01L 23/544* (2006.01)
(52) U.S. Cl. .............................. 257/797; 257/E23.179; 438/401; 438/462
(58) Field of Classification Search ................. 438/401, 438/462; 257/797, E23.179
See application file for complete search history.

(56) References Cited

U.S. PATENT DOCUMENTS

| 5,087,547 | A |   | 2/1992  | Taylor et al.           |
|-----------|---|---|---------|-------------------------|
| 5,451,261 | A | * | 9/1995  | Fujii et al. ...... 118/728 |
| 5,640,053 | A |   | 6/1997  | Caldwell                |
| 5,695,897 | A | * | 12/1997 | Mitome et al. ...... 430/22 |
| 5,733,711 | A |   | 3/1998  | Juengling               |
| 5,911,108 | A | * | 6/1999  | Yen ...... 438/401      |
| 5,968,687 | A | * | 10/1999 | Chang et al. ...... 430/5 |
| 6,057,206 | A | * | 5/2000  | Nguyen et al. ...... 438/401 |
| 6,261,918 | B1|   | 7/2001  | So                      |
| 6,271,602 | B1|   | 8/2001  | Ackmann et al.          |

(Continued)

OTHER PUBLICATIONS

Gozdz et al., "tert-Butoxycarbonylated novolaces as chemically amplified dual-tone resists," pp. 4653-4655, Polymer, 1992, vol. 33, No. 21.

(Continued)

*Primary Examiner*—Michelle Estrada
*Assistant Examiner*—Jarrett J Stark
(74) *Attorney, Agent, or Firm*—TraskBritt

(57) ABSTRACT

An alignment mark mask element protects an underlying alignment mark during subsequent processing of a fabrication substrate. The alignment mark mask element is formed concurrent with formation of a photomask from a dual-tone photoresist that exhibits a pattern reversal upon exposure to an energy level. A portion of the dual-tone photoresist above the alignment mark is exposed to an energy sufficient to reverse a positive tone resist to a negative tone, which remains above the alignment mark after developing. The remainder of the dual-tone photoresist is exposed through a reticle at a lesser energy level and patterned to define aperture locations of a photomask for formation of semiconductor device features. In addition, a photomask for use on a fabrication substrate and an intermediate semiconductor device are disclosed. Methods of forming a photomask and an intermediate semiconductor device structure are also disclosed.

15 Claims, 3 Drawing Sheets

U.S. PATENT DOCUMENTS

| | | |
|---|---|---|
| 6,290,631 B2 | 9/2001 | Chu et al. |
| 6,326,278 B1 * | 12/2001 | Komuro ................. 438/401 |
| 6,342,426 B1 | 1/2002 | Li et al. |
| 6,350,658 B1 | 2/2002 | Miraglia |
| 6,368,972 B1 | 4/2002 | Maury et al. |
| 6,383,888 B1 | 5/2002 | Stirton |
| 6,391,737 B1 * | 5/2002 | Ku et al. ................. 438/401 |
| 6,417,076 B1 * | 7/2002 | Holscher et al. ......... 438/462 |
| 6,432,790 B1 * | 8/2002 | Okamoto et al. ......... 438/377 |
| 6,462,428 B2 * | 10/2002 | Iwamatsu ................. 257/797 |
| 2002/0005594 A1 * | 1/2002 | Iwamatsu ................. 257/797 |
| 2002/0052088 A1 * | 5/2002 | Okamoto et al. ......... 438/377 |
| 2002/0052091 A1 * | 5/2002 | Holscher et al. ......... 438/401 |
| 2003/0081188 A1 * | 5/2003 | Suzuki ................... 355/51 |

OTHER PUBLICATIONS http://www.mems-exchange.org/users/masks/intro-equipment.html, MEMS Exchange, "Layout and Mask Conventions," pp. 1-10.

JSR Microelectronics, "Technical Data, Performance of KrF TMX1143Y (M78Y)," 4 pages.

http://www.mems-exchange.org/users/masks/intro-equipment.html, MEMS Exchange, "Layout and Mask Conventions," pp. 1-10, May 8, 2002.

JSR Microelectronics, "Technical Data, Performance of KrF TMX1143Y (M78Y)," 4 pages, Jul. 21, 2004.

* cited by examiner

USE OF A DUAL-TONE RESIST TO FORM PHOTOMASKS INCLUDING ALIGNMENT MARK PROTECTION, INTERMEDIATE SEMICONDUCTOR DEVICE STRUCTURES AND BULK SEMICONDUCTOR DEVICE SUBSTRATES

CROSS-REFERENCE TO RELATED APPLICATION

This application is a divisional of application Ser. No. 10/219,168, filed Aug. 15, 2002, now U.S. Pat. No. 6,815,308, issued Nov. 9, 2004.

BACKGROUND OF THE INVENTION

1. Field of the Invention

The present invention relates to forming an alignment mark mask element over an alignment mark on a semiconductor substrate. More specifically, the present invention relates to using a dual-tone photoresist to form the alignment mark mask element in conjunction with a photomask from the same photoresist material, thereby enabling semiconductor device features to be formed up to a peripheral edge of the alignment mark which is protected by the mask element.

2. State of the Art

To fabricate an integrated circuit on a semiconductor substrate such as a wafer, multiple layers of conductors and insulators are patterned and formed upon one another. In order to preserve circuit continuity, it is critical that each layer is aligned to a previous layer with great precision and accuracy. The alignment of layers is conventionally accomplished using a wafer stepper. The wafer stepper transfers a desired pattern situated on a reticle or mask onto a layer formed on the semiconductor wafer. In a typical alignment operation, the semiconductor wafer is coated with a transparent photosensitive material, such as a photoresist, and loaded into the wafer stepper. The wafer stepper uses an alignment mark on the semiconductor wafer as a reference point to adjust the position of the reticle over the semiconductor wafer to precisely align the reticle to the previous layer on the semiconductor wafer. The alignment mark is also referred to as a "fiducial mark" or a "combi mark."

The wafer stepper uses a laser beam with a fixed wavelength to sense the position of the alignment mark on the semiconductor wafer. Light from the laser beam is reflected off the alignment mark to create a diffraction pattern. The diffraction pattern from the alignment mark is reflected to sensing devices in the wafer stepper and is used as a signal to indicate the exact position of the alignment mark. The signals are analyzed and used to determine the position of the alignment mark. The alignment mark on the semiconductor wafer is then aligned with corresponding marks on other layers, such as a photomask.

Referring to FIG. 1, an alignment mark 5 is formed by etching a semiconductor wafer 10 to create a trench or plurality of trenches or grooves in a surface of the semiconductor wafer 10. The trenches or grooves of the alignment mark 5 are typically formed in known areas of the semiconductor wafer 10 and have a known pattern, orientation and spatial relationship. As illustrated in FIG. 1, the alignment mark 5 is usually formed along a peripheral edge of the semiconductor wafer 10 or near scribe lines that separate locations of semiconductor dice 15 on the semiconductor wafer 10. The trenches or grooves of the alignment mark 5 create a difference in step height in the semiconductor wafer 10, which is detected when the laser beam is reflected off the alignment mark 5 or a layer thereover. Integrated circuits of the semiconductor dice 15 are typically not formed on or near the alignment marks 5, thereby making these portions of the semiconductor wafer 10 wasted space or "real estate" on or immediately adjacent to which semiconductor dice 15 cannot be formed.

After the indicia of the alignment mark 5 have been etched into the semiconductor wafer 10, additional layers of material are deposited to form the desired integrated circuits elsewhere on the substrate, the layers also incidentally being deposited over alignment mark 5. These additional layers are, in turn, patterned and etched to form field isolation regions, polysilicon conductors, or interlayer dielectrics on the semiconductor wafer 10. Depending on the material composition of these additional layers, the alignment mark 5 can become optically invisible when additional layers are deposited over the alignment mark 5. However, since these additional layers are typically deposited conformally, the step height of the alignment mark 5 is transferred into the subsequently deposited layers. Therefore, the transferred alignment mark remains optically visible and may still be used for alignment purposes. In addition, some of the additional layers are optically transparent and, therefore, the alignment mark 5 remains visible through these layers.

Integrity of the alignment mark is commonly adversely affected during subsequent processing steps. For example, the alignment mark or transferred alignment mark is damaged by abrasive polishing techniques such as chemical mechanical polishing ("CMP"). CMP techniques are not tightly controlled at the edges of the semiconductor wafer, where the alignment marks are located, because no integrated circuits are located there. Therefore, it is common to overpolish when using CMP techniques and to remove portions of the semiconductor wafer in which the alignment mark is formed. In addition, CMP techniques may remove the alignment marks or flatten the edges of the alignment marks so that the necessary reflection off the alignment mark by the laser beam is not obtained.

Various solutions to recover or repair damaged alignment marks have been proposed. See, for example, U.S. Pat. No. 6,290,631 to Chu et al., U.S. Pat. No. 6,261,918 to So, U.S. Pat. No. 6,271,602 to Ackmann et al., U.S. Pat. No. 6,368,972 to Maury et al., and U.S. Pat. No. 6,350,658 to Miraglia et al. In addition, solutions to protect the alignment marks have been proposed. In both U.S. Pat. No. 6,342,426 to Li et al. and U.S. Pat. No. 6,326,278 to Komuro, a photoresist layer is formed on an underlying conductive layer, which extends over an alignment mark. The photoresist is patterned for etching of the conductive layer and to leave a protective metal layer portion over the alignment mark.

U.S. Pat. No. 6,417,076 to Holscher et al., assigned to the assignee of the present invention and the disclosure of which is incorporated herein by reference, discloses an approach to protecting alignment marks by depositing a globule of protective material over the alignment marks and, in some instances, at least partially over conductive patterning adjacent an alignment mark to protect same.

It would be desirable to form an alignment mark mask element over the alignment mark in the course of forming a photomask so that the alignment mark is protected from damage by subsequent processing steps. In addition, it would be desirable to reduce the wasted space on the semiconductor wafer and to increase the number of semiconductor dice that is formed per wafer by enabling formation of semiconductor device features, such as integrated circuits, in closer proximity to alignment marks.

BRIEF SUMMARY OF THE INVENTION

The present invention relates to a method of forming an intermediate semiconductor device structure. The method comprises providing a fabrication substrate such as a semiconductor wafer or other bulk substrate having a layer of semiconductor material thereon and comprising at least one alignment mark. A photoresist layer is applied over the fabrication substrate. The photoresist comprises a dual-tone resist that reverses from a positive tone to a negative tone upon exposure to radiation of an appropriate wavelength and energy level. Selected portions of the photoresist layer applied to the wafer are exposed to radiation of an appropriate wavelength at a first energy to define the location and shape of semiconductor device features at a plurality of semiconductor device locations on the fabrication substrate. Only the portion of the photoresist layer above the alignment mark is then exposed to radiation of an appropriate wavelength at a second, different energy. The photoresist layer is then developed so that the portion of the photoresist exposed to the second energy remains over the alignment mark to form a protective mask element while the portions of the photoresist exposed to the first energy are removed during developing, resulting in apertures in the photomask.

A photomask for use on a fabrication substrate is disclosed. The photomask is formed from a photoresist layer, which is selectively exposed to radiation and developed to respectively define and form apertures at selected locations. The apertures are configured to facilitate etching of desired locations of an underlying material layer to form semiconductor device features or portions thereof. Some of the apertures of the photomask may be placed at locations which extend to an outer periphery of the fabrication substrate and which are not used conventionally for fabrication of semiconductor dice. At least one alignment mark mask element is positioned to substantially shield a region of the underlying material layer which is located over an alignment mark on the fabrication substrate. The portions of the material layer which are exposed through apertures in the photomask, including those located adjacent to the alignment mark, may be etched to a location substantially adjacent a peripheral edge of the alignment mark, wherein at least one of the apertures may extend substantially to a peripheral edge of the alignment mark mask element.

An intermediate semiconductor device structure is also disclosed. The intermediate semiconductor device structure comprises a fabrication substrate having at least one alignment mark, at least one material layer over the fabrication substrate, and a photomask over the at least one material layer. The photomask comprises apertures located over at least a portion of the photoresist layer. The apertures are configured to facilitate etching of selected locations of the material layer. The photomask also comprises at least one alignment mark mask element that is positioned to substantially shield an underlying alignment mark on the fabrication substrate without shielding portions of the underlying material layer closely adjacent to the alignment mark. These unshielded portions of the material layer may be etched through apertures in the photomask placed immediately adjacent to a peripheral edge of the alignment mark to form at least portions of semiconductor device features from the underlying material layer. Accordingly, at least one of the apertures may have a boundary substantially at a peripheral edge of the alignment mark mask element.

In addition, a semiconductor device structure is disclosed. The semiconductor device structure comprises a fabrication substrate having at least one alignment mark and at least one semiconductor device feature on the fabrication substrate. The at least one semiconductor device feature abuts a peripheral edge of a coplanar material layer located over the at least one alignment mark.

BRIEF DESCRIPTION OF THE SEVERAL VIEWS OF THE DRAWINGS

In the drawings, which illustrate what is currently considered to be the best mode for carrying out the invention.

DETAILED DESCRIPTION OF THE INVENTION

The present invention relates to using an alignment mark mask element to cover an alignment mark on a fabrication substrate such as a semiconductor wafer or other bulk substrate comprising a layer of semiconductor material. The term "bulk substrate" as used herein includes not only silicon wafers, but silicon on insulator (SOI) substrates, silicon on sapphire (SOS) substrates, epitaxial layers of silicon on a base semiconductor foundation and other semiconductor materials such as silicon-germanium, germanium, gallium arsenide and indium phosphide. The alignment mark mask element protects the underlying alignment mark during subsequent processing of the fabrication substrate. The alignment mark mask element is formed from a dual-tone photoresist that exhibits a pattern reversal upon exposure to radiation of an appropriate wavelength and energy level. Portions of the dual-tone photoresist may be exposed to radiation of an appropriate wavelength to define aperture locations in the photomask for subsequent etching of semiconductor device features. Another portion of the dual-tone photoresist above the alignment mark is exposed to radiation of an appropriate wavelength and of a different energy level to reverse the positive tone of the resist to a negative tone. Using the alignment mark mask element to protect the alignment mark enables semiconductor device features to be formed in a layer of material very close to a peripheral edge of the alignment mark.

Figure 2:
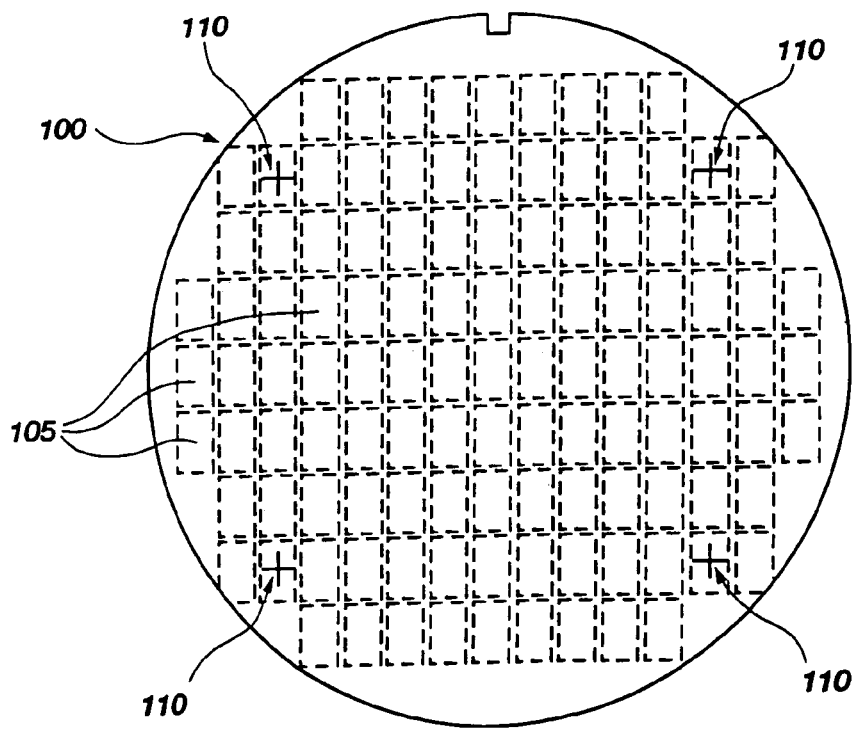
FIG. 2 shows a fabrication substrate according to the present invention, wherein semiconductor device locations are placed in close proximity to the alignment marks.

A method of forming an intermediate semiconductor device structure is disclosed. The method comprises providing a fabrication substrate having at least one alignment mark. As shown in FIG. 2, a fabrication substrate 100, such as a semiconductor wafer or other bulk semiconductor substrate, may comprise multiple semiconductor device (such as die) locations 105 that are arranged in a grid pattern of rows and columns. The fabrication substrate 100 also includes alignment marks 110, which may be located near the periphery of the fabrication substrate 100. Integrated circuits are formed on the semiconductor device locations 105 using, among other semiconductor device fabrication techniques, photolithographic processing as known in the art. Photolithographic processing may be performed on multiple semiconductor device locations 105 at a time, depending on the reticle or mask that is used to expose a photoresist layer formed on fabrication substrate 100. For example, the exposure step is performed on approximately twelve to twenty semiconductor device locations 105 at a time, after which the reticle is shifted to a different group of semiconductor device locations 105, which shifting continues until exposure of the entire fabrication substrate 100 is completed.

Figure 3:
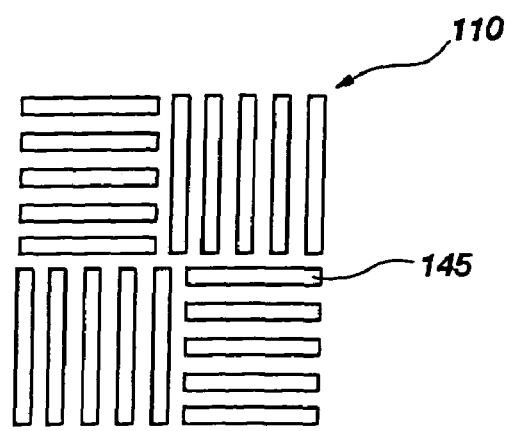
FIG. 3 is a representation of an exemplary alignment mark.

As depicted in FIG. 3, alignment marks 110 may be formed in the fabrication substrate 100 by known processes, such as by etching one or more trenches or grooves 145 into the fabrication substrate 100 at selected locations thereof, as known in the art. The alignment mark 110 may comprise a trench or groove 145 or multiple trenches or grooves 145 that are arranged in a particular spatial pattern and mutual orientation, such as the exemplary pattern shown in FIG. 3. In addition to the pattern shown in FIG. 3, the trenches or grooves 145 may, of course, be arranged in alternative patterns. It is also contemplated, and conventional, that multiple alignment marks 110 may be formed on the fabrication substrate 100. An alignment mark 110 or a set of alignment marks 110 may be formed in various locations on the fabrication substrate 100. For example, the alignment mark 110 or the set of alignment marks 110 may be formed in close proximity to a peripheral edge of the fabrication substrate 100. By forming multiple alignment marks 110 on various portions of the fabrication substrate 100, each alignment mark 110 is potentially exposed to different processing environments. Therefore, even if one alignment mark 110 or a set of alignment marks 110 is damaged, the remaining alignment marks 110 may remain undamaged and may still be used for alignment. In addition, the use of multiple alignment marks 110 may enhance registration over the various areas of the fabrication substrate 100.

Figure 4:
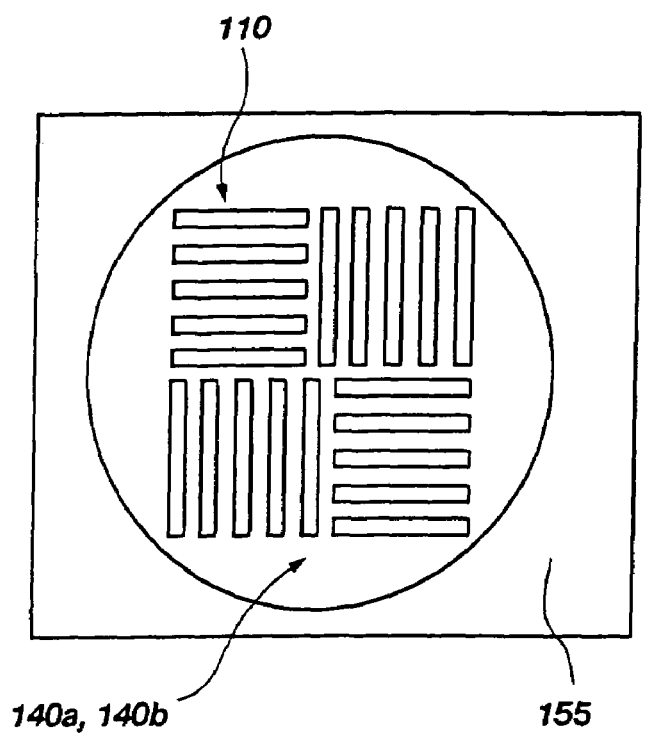
FIG. 4 shows a portion of a photomask formed in a clearfield pattern into a protective mask element by reversing a photoresist layer from a positive tone to a negative tone.

A material layer 120 (see FIGS. 5A-7) may be formed or deposited over the fabrication substrate 100 to include one or more alignment marks 110, as shown in FIG. 4. The material layer 120 may be deposited conformally and, therefore, the trenches or grooves 145 of alignment marks 110 may translate into the material layer 120. The material layer 120 may comprise a metal layer, a doped semiconductor layer, a silicon nitride layer, a dielectric layer, or any other suitable layer, depending on the semiconductor device features that are ultimately to be formed therefrom. A desired pattern may be subsequently etched, through apertures in a subsequently formed photomask 130 (see FIG. 6), into the material layer 120 to form the desired semiconductor device features. The composition of the material layer 120 is not essential to the present invention and, therefore, will not be discussed in detail herein.

Figure 5A:
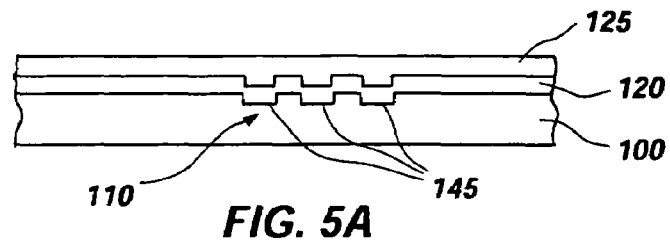
FIG. 5A is a representation of a precursor to an intermediate semiconductor substrate of the present invention.

A photoresist layer 125 is also formed on the fabrication substrate 100, as shown in FIG. 5A. The photoresist layer 125 may be applied to the material layer 120, as known in the art. For example, the photoresist layer 125 may be spin coated over the material layer 120. The photoresist layer 125 may comprise a photoresist that exhibits a pattern reversal, such as a reversal from a positive tone to a negative tone. It is also contemplated that the use of a photoresist that exhibits a pattern reversal from a negative tone to appositive tone is within the scope of the present invention. Such a photoresist is referred to herein as a "dual-tone" resist or photoresist. The dual-tone resist may produce positive or negative images depending on the processing conditions used to reverse the pattern. For example, the dual-tone resist may produce positive or negative images based on the concentration of developers used in subsequent photolithographic steps, the developer strength, development time, flood energy, level of dissolution inhibitor, softbake, and hardbake. Also, the dual-tone photoresist may produce positive or negative images based on the exposure energy. For example, the pattern reversal may be induced by an overexposure to energy. The use of such photoresists is currently preferred for practice of the present invention. Dual-tone resists that exhibit pattern reversal upon overexposure to energy include, but are not limited to, M78Y and M172Y photoresists, which are available from JSR Microelectronics (Sunnyvale, Calif.).

Figure 5B:
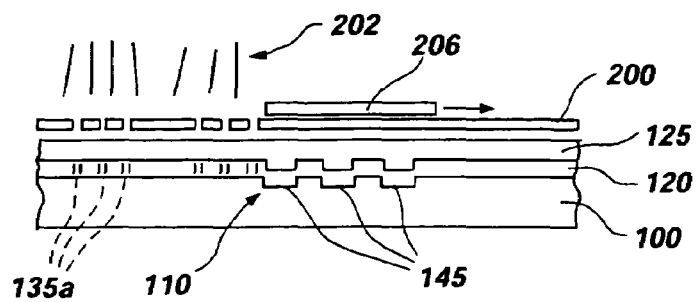
FIG. 5B is a representation of first portions of a photoresist layer of FIG. 5A being exposed through a reticle to a first energy.
Figure 5C:
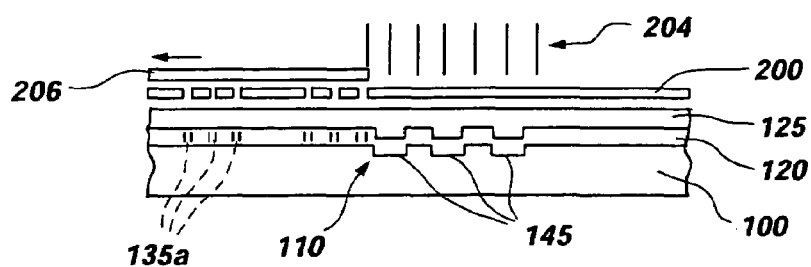
FIG. 5C is a representation of a second portion of the photoresist layer of FIG. 5A being exposed to a second, different energy.

First portions 135a of the photoresist layer 125 as shown in broken lines may be exposed through a reticle 200 as shown in FIG. 5B to a first energy 202 that is sufficient, upon development, to result in apertures 135 in the resulting photomask 130 (FIG. 6) to form the desired pattern of semiconductor device features 155 (FIG. 4) in the material layer 120. A so-called "clearfield pattern" may be defined in the design of fabrication substrate 100 to create a boundary around which the semiconductor device features 155 may ultimately be patterned. As shown in FIG. 4, the clearfield pattern 140a may be of a sufficient size to substantially cover the alignment mark 110. Although the clearfield pattern 140a is depicted as a circle, the clearfield pattern 140a may be a square or any other pattern of sufficient size to substantially cover the alignment mark 110. It is desirable to size and configure the clearfield pattern 140a to cover as little surface area of fabrication substrate 100 as possible while still protecting alignment mark 110. The portion of the photoresist layer 125 within the clearfield pattern 140a may be exposed, through the reticle 200, to a second, different energy 204 than that to which the first portions 135a are exposed and which is sufficient to reverse the tone of the dual-tone resist, as shown in FIG. 5C. For example, the second energy 204 may be sufficient to reverse the positive tone resist to a negative tone. The portions of the photoresist layer 125 may be selectively exposed to the desired energy by "blading" off desired portions of the reticle 200. For instance, the clearfield pattern 140a may be covered by a reamer blade 206 or a masking blade while the first portions 135a of the photoresist layer 125 are exposed. The reamer blade 206 may then be removed to expose the portion of the photoresist layer 125 within the clearfield pattern 140a. The portions of the photoresist layer 125 outside the clearfield pattern 140a are not exposed to the second energy 204 and, therefore, remain a positive tone.

After the different portions of the photoresist layer 125 have been exposed to the first and second energies 202, 204 to respectively define locations of apertures on the areas of photoresist layer 125 outside the clearfield pattern 140a and to reverse the area within the clearfield pattern 140a from a positive tone to a negative tone, the photoresist layer 125 is developed, as known in the art, to form the photomask 130. Upon developing, the negative tone resist within the clearfield pattern 140a remains over the alignment mark 110 and forms the alignment mark mask element 140b of the resulting photomask 130. The portions of the positive tone resist exposed to the first energy 202 are removed by the developing, thereby creating the apertures 135 defined in the photoresist layer 125 at the exposed locations. The apertures 135 may be formed at locations extending substantially up to a periphery of the boundary of the alignment mark mask element 140b created by the clearfield pattern 140a. Therefore, the semiconductor device features 155 to be formed in the material layer 120 may be placed substantially up to the periphery of the alignment mark 110. Since the alignment mark 110 remains shielded from etchants by the alignment mark mask element 140*b* of the photomask 130, the semiconductor device features 155 may be formed in the material layer 120 so as to extend substantially to an outer periphery of the alignment mark 110 and abut the edge of alignment mark mask element 140*b*.

After development, portions of the photomask 130 may have varying thicknesses depending on the energy of radiation to which the preceding photoresist layer 125 was exposed. For instance, a portion of the photoresist layer 125 that was not exposed to any energy may result in a corresponding area of the photomask 130 having a thickness similar to the thickness at which the photoresist layer 125 was applied. In other words, this thickness is approximately 1.0 or 100%. Portions of the photoresist layer 125 that were exposed to a first energy may be substantially removed after development to form apertures 135 and, therefore, the thickness of the photoresist layer 125 at these portions is approximately 0. After exposure to a higher, second energy of radiation sufficient to reverse the tone of the photoresist, the thickness of portions of the photomask 130 that correspond to portions of the photoresist layer 125 that were exposed to the second energy of radiation to form alignment mark mask element 140*b* may be greater than approximately 0 but less than approximately 1.0. For instance, these portions of the photoresist layer 125 may have a thickness of about 60% (0.6) of the thickness of other areas of the photomask 130.

Using the dual-tone resists previously described, portions of the photoresist layer 125 are selectively exposed (i.e., through a reticle) to a first energy of approximately 6-10 mJ or greater to form a photomask 130 after development with apertures 135 in desired locations. The first energy may, for example, be approximately 20 mJ. The apertures 135 may subsequently be used to create the desired semiconductor device features 155 in the material layer 120 that underlies the photomask 130. The portion of the photoresist layer 125 within the clearfield pattern 140*a* (i.e., over the alignment marks 110) is reversed to a negative tone upon exposure to a second energy of approximately 60 mJ or greater. The second energy may, for example, be approximately 85 mJ. Only the area of the photoresist layer 125 within the clearfield pattern 140*a* is exposed to the second energy and reversed to a negative tone. The remainder of the photoresist layer 125 is not exposed to the second energy and remains a positive tone. Following development of the selectively exposed photoresist layer 125, the regions thereof that were located within the clearfield patterns 140*a* and, thus, over the alignment marks 110 become solid alignment mark mask elements 140*b* of the resulting photomask 130. After development, the thickness of the alignment mark mask element 140*b* of the photomask 130 is approximately 60% of the thickness of the other remaining portions of the photomask 130.

Figure 6:
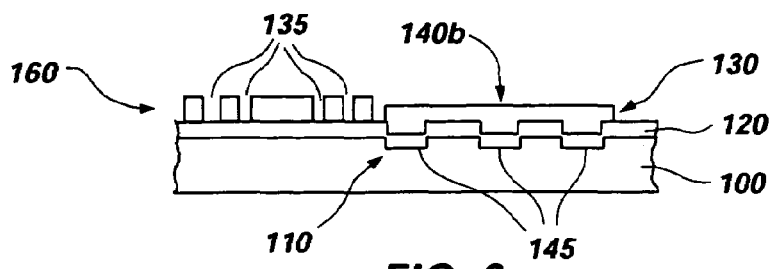
FIG. 6 shows an exemplary photomask and an intermediate semiconductor substrate according to the present invention.
Figure 7:
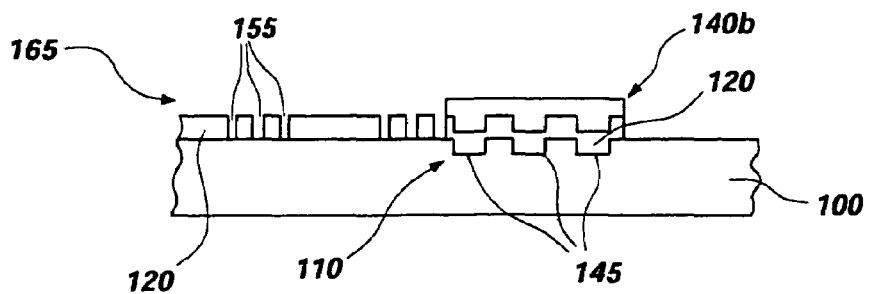
FIG. 7 is an exemplary semiconductor device structure according to the present invention.

The photomask 130 may be used to form semiconductor device features 155 from the material layer 120 on the fabrication substrate 100, as known in the art. The photomask 130 includes apertures 135 that are located over substantially the entire surface of the fabrication substrate 100. FIG. 6 shows the developed photomask 130 formed over the underlying material layer 120 and fabrication substrate 100. In addition, as known in the art, the photomask 130 may be a sufficient size so that multiple semiconductor devices, at multiple semiconductor device locations 105 (e.g., over substantially the entire fabrication substrate 100), may be patterned at one time. The apertures 135 of the photomask 130 formed by removal of portions of photoresist layer 125 exposed to the first energy are sized, configured and located to facilitate etching of the underlying material layer 120 to produce the desired pattern of semiconductor device features 155 from the material layer 120 on the fabrication substrate 100, as shown in FIG. 7. At least one alignment mark mask element 140*b* may be positioned to substantially shield at least one alignment mark 110 without shielding portions of the material layer 120 that are laterally adjacent to the alignment mark 110. These nonshielded regions of the material layer 120, which may be selectively exposed through apertures 135 in photomask 130, are subsequently etched to produce the desired semiconductor device features 155. Using this photomask 130, the desired semiconductor device features 155 may be etched in the material layer 120, if desired, substantially to a peripheral edge of the alignment mark 110 because boundaries of the apertures 135 in the photomask 130 may extend substantially to the peripheral edge of the alignment mark mask element 140*b* and expose regions of the material layer 120 that extend substantially adjacent to, but not over, the alignment mark 110.

As previously mentioned, the alignment mark mask element 140*b* may be positioned to substantially shield the alignment mark 110 without shielding portions of the material layer 120 that are immediately laterally adjacent to the alignment mark 110. The alignment mark mask element 140*b* may comprise at least a solid portion of the photomask 130 that is located over the material layer 120.

An intermediate semiconductor device structure 160 may be produced that comprises a fabrication substrate 100 having at least one alignment mark 110, as shown in FIG. 6. A material layer 120 may be formed over the fabrication substrate 100. It is also contemplated that more than one material layer 120 may be formed over the fabrication substrate 100 depending on the integrated circuit that is to ultimately be produced. A photomask 130 may be formed over the material layer 120. The photomask 130 includes apertures 135 positioned across substantially the entire surface of the fabrication substrate 100. The apertures 135 are located and configured to facilitate etching of the underlying material layer 120 so that semiconductor device features 155 or portions thereof may be formed. The photomask 130 also comprises at least one alignment mark mask element 140*b* that is positioned so as to substantially shield areas of the material layer 120 located over each alignment mark 110 on the fabrication substrate 100 from etchants during patterning of other areas of the material layer 120. Nonshielded portions of the material layer 120 (i.e., those areas which are exposed through the apertures 135 in the photomask 130) are to be etched with the desired pattern of semiconductor device features 155. The pattern of semiconductor device features 155 may extend substantially to a peripheral edge of the alignment mark 110.

A semiconductor device structure 165 comprising the fabrication substrate 100 and at least one semiconductor device feature 155 may thus be formed, as illustrated in FIG. 7. The semiconductor device features 155 may be insulative structures, conductive structures, semiconductive structures, or other types of structures that are typically included in semiconductor devices or portions of any of the foregoing, each of which may be formed by patterning a material layer 120 located over the fabrication substrate 100. The semiconductor device structure 165 also comprises at least one alignment mark 110 formed in or located on the fabrication substrate 100 and protected by alignment mark mask element 140*b*. By using the dual-tone resists described above, the semiconductor device features 155 may be formed laterally closer to the alignment mark 110 than was previously possible. Semiconductor device features 155 may abut a peripheral edge of the alignment mark 110. Since semiconductor device features 155 may be formed closer to the alignment mark 110 due to the presence of protective alignment mark mask element 140b, there is less wasted space or real estate on the fabrication substrate 100. As such, additional semiconductor devices may be formed on the fabrication substrate 100 in locations which were conventionally "dead" or had no semiconductor device features 155 fabricated thereon, thereby increasing the overall yield of the fabrication substrate 100. While at least some of the resulting, additional semiconductor devices may be functional, it is also contemplated that some of the additional semiconductor devices may be nonfunctional and the alignment marks placed thereon since there is no need when using the present invention to place alignment marks in open areas on fabrication substrate 100 or at particular locations.

Figure 1:
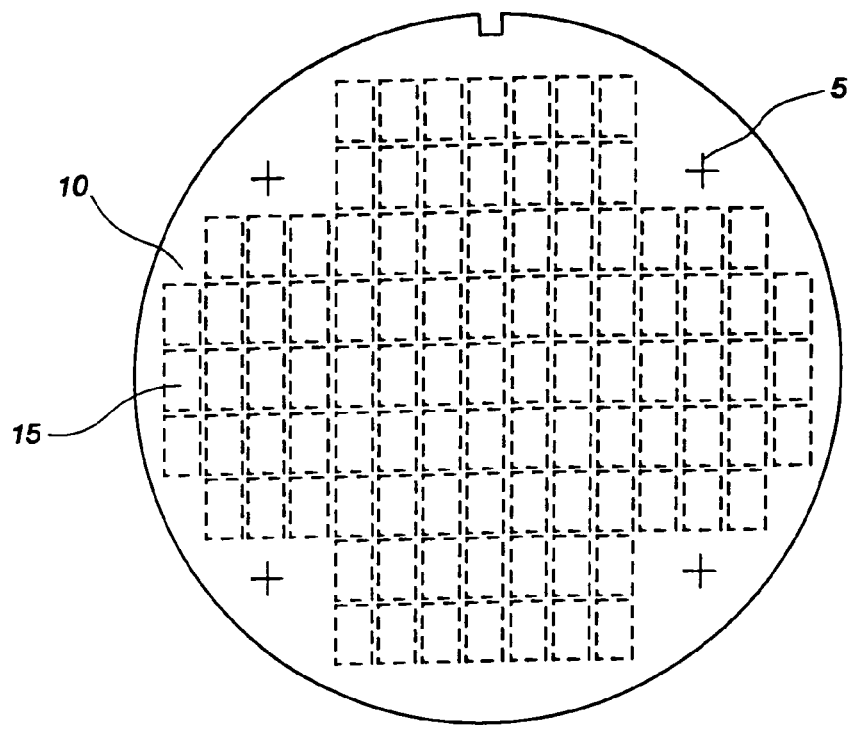
FIG. 1 illustrates a prior art semiconductor wafer having alignment marks located along the periphery thereof.

Using the dual-tone resists to form alignment mark mask elements 140b over the alignment marks 110 improves and simplifies the process of fabricating semiconductor device locations 105. While dual-tone resists may initially have a positive tone, exposing a portion of such a dual-tone resist overlying the alignment mark 110 to radiation of an increased energy may reverse the tone in that portion to a negative tone resist. The alignment mark mask element 140b is thus formed from the portion of negative tone resist and is located over the alignment mark 110. Since the alignment mark 110 is shielded by the alignment mark mask element 140b, field placement is no longer limited to a placement that provides good alignment mark cutouts. Rather, the fields may be placed on the fabrication substrate 100 to maximize the number of dice per wafer since the semiconductor device features 155 may be patterned to lateral locations that extend substantially to locations immediately adjacent the outer peripheries of the alignment marks 110. This is shown most clearly by a comparison of FIG. 1 and FIG. 2, wherein the latter shows that semiconductor device features 155 (FIG. 7) may be formed closer to the alignment marks 110 than is possible when conventional photomask-forming processes are used. In addition, the location of the alignment marks 110 on the fabrication substrate 100 is more flexible because the alignment marks 110 and semiconductor device features 155 may now be in much closer proximity to each other. It is also possible to locate the alignment marks 110 in a nonfunctional semiconductor device location 105 as shown in FIG. 2. Therefore, the yield of semiconductor devices from a fabrication substrate 100 of given dimensions may be improved because additional, functional semiconductor devices may be fabricated on the fabrication substrate 100. In addition, the number of die candidates may be increased due to the substantially full fabrication substrate 100 coverage.

The alignment mark mask element 140b protects the alignment mark 110 from damage, such as the damage caused by CMP. CMP uniformity also improves through use of the present invention because there are no longer significant open areas on the fabrication substrate 100 which may be overpolished or removed during CMP. In other words, since the surface texture and thickness of the fabrication substrate 100 laterally adjacent to the alignment marks 110 resembles the surface texture and thickness of the remainder of the fabrication substrate 100, the problems discussed above with CMP uniformity are reduced. In addition, registration also improves and results in a decreased center to edge of wafer delta in terms of locational errors. This improvement largely shows up in yield, with a higher edge-die yield than with conventional techniques.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents, and alternatives falling within the spirit and scope of the invention as defined by the following appended claims.

What is claimed is:

1. A photomask for use on a fabrication substrate, comprising:
   a plurality of apertures located over at least a portion of a developed photoresist layer, wherein the plurality of apertures are configured to facilitate etching of an underlying material layer on a fabrication substrate; and
   at least one alignment mark mask element formed of material of the developed photoresist layer and positioned to substantially shield only an underlying alignment mark on the fabrication substrate without shielding portions of the underlying material layer adjacent to the underlying alignment mark, wherein at least one of the plurality of apertures extends to a peripheral edge of the at least one alignment mark mask element.

2. The photomask of claim 1, wherein the developed photoresist layer comprises a photoresist that is formulated to exhibit a pattern reversal from a positive tone to a negative tone.

3. The photomask of claim 1, wherein the developed photoresist layer comprises a photoresist that is formulated to exhibit a pattern reversal related to an energy of radiation to which the photoresist is exposed.

4. The photomask of claim 1, wherein the at least one alignment mark mask element comprises a portion of a photoresist layer that has been reversed from a positive tone to a negative tone.

5. The photomask of claim 1, wherein the at least one alignment mark mask element comprises a portion of the developed photoresist layer that has been reversed from a positive tone to a negative tone upon exposure to an energy of radiation of approximately 85 mJ.

6. The photomask of claim 1, wherein the plurality of apertures comprises portions of the developed photoresist layer exposed to an energy of radiation of approximately 20 mJ.

7. The photomask of claim 1, wherein a thickness of the at least one alignment mark mask element is related to energy to which the developed photoresist layer has been exposed.

8. An intermediate semiconductor device structure, comprising:
   a fabrication substrate comprising at least one alignment mark;
   at least one material layer over the fabrication substrate; and
   a photomask over the at least one material layer, comprising:
      apertures located over at least a portion of the photomask, wherein the apertures are configured to facilitate etching of the at least one material layer on the fabrication substrate; and
      at least one alignment mark mask element formed of material of the photomask and positioned to substantially shield the at least one alignment mark without shielding portions of the at least one material layer adjacent to the at least one alignment mark, wherein at least one of the apertures extends to a peripheral edge of the at least one alignment mark mask element.

9. The intermediate semiconductor device structure of claim 8, wherein the photomask comprises a photoresist material that is formulated to exhibit a pattern reversal from a positive tone to a negative tone.

10. The intermediate semiconductor device structure of claim 8, wherein the photomask comprises a photoresist material that is formulated to exhibit a pattern reversal related to an energy of radiation to which the photoresist material is exposed.

11. The intermediate semiconductor device structure of claim 8, wherein the at least one alignment mark mask element comprises a portion of the photomask formed of a photoresist material reversed from a positive tone to a negative tone.

12. The intermediate semiconductor device structure of claim 8, wherein the at least one alignment mark mask element comprises a portion of the photomask formed of a photoresist material reversed from a positive tone to a negative tone upon exposure to a wavelength of radiation of approximately 85 mJ.

13. The intermediate semiconductor device structure of claim 12, wherein a thickness of the at least one alignment mark mask element is related to an energy of radiation to which the portion of the photoresist material has been exposed to reverse the positive tone to the negative tone.

14. A semiconductor device structure, comprising:
a fabrication substrate comprising at least one alignment mark on a peripheral edge thereof;
at least one alignment mark mask element comprising a photoresist material; and
at least one semiconductor device feature on the fabrication substrate, wherein the at least one semiconductor device feature abuts a peripheral edge of the at least one alignment mark, and wherein the at least one alignment mark mask element substantially shields the at least one alignment mark without shielding portions of the at least one semiconductor device feature abutting the peripheral edge of the at least one alignment mark.

15. A semiconductor device structure, comprising:
a bulk substrate fully populated with semiconductor die locations;
at least one alignment mark mask element comprising a photoresist material; and
at least one alignment mark located on a peripheral edge of the bulk substrate and residing within one of the semiconductor die locations, wherein the at least one alignment mark mask element substantially shields the at least one alignment mark without shielding portions of the semiconductor die locations adjacent to the at least one alignment mark.

* * * * *

UNITED STATES PATENT AND TRADEMARK OFFICE
CERTIFICATE OF CORRECTION

PATENT NO. : 7,408,265 B2  Page 1 of 1
APPLICATION NO. : 10/897165
DATED : August 5, 2008
INVENTOR(S) : Holscher et al.

It is certified that error appears in the above-identified patent and that said Letters Patent is hereby corrected as shown below:

In column 10, line 33, in Claim 4, delete "clement" and insert -- element --, therefor.

In column 12, line 4, in Claim 14, delete "clement" and insert -- element --, therefor.

Signed and Sealed this

Seventh Day of October, 2008

JON W. DUDAS
*Director of the United States Patent and Trademark Office*